(12) United States Patent
Myers et al.

(10) Patent No.: US 11,121,415 B2
(45) Date of Patent: Sep. 14, 2021

(54) MONITORING SYSTEM FOR SERIES-CONNECTED BATTERY CELLS

(71) Applicant: LiTech Laboratories, LLC, Austin, TX (US)

(72) Inventors: Robert L. Myers, Austin, TX (US); Alexei Tikhonski, Austin, TX (US); James P. Novak, Austin, TX (US)

(73) Assignee: Litech Laboratories, Inc., Austin, TX (US)

( * ) Notice: Subject to any disclaimer, the term of this patent is extended or adjusted under 35 U.S.C. 154(b) by 125 days.

(21) Appl. No.: 16/471,961

(22) PCT Filed: Aug. 4, 2017

(86) PCT No.: PCT/US2017/045468
§ 371 (c)(1),
(2) Date: Jun. 20, 2019

(87) PCT Pub. No.: WO2018/147897
PCT Pub. Date: Aug. 16, 2018

(65) Prior Publication Data
US 2019/0312318 A1    Oct. 10, 2019

Related U.S. Application Data

(60) Provisional application No. 62/456,371, filed on Feb. 8, 2017.

(51) Int. Cl.
*H01M 10/48* (2006.01)
*H01M 10/42* (2006.01)
*G01R 31/396* (2019.01)

(52) U.S. Cl.
CPC ........ *H01M 10/482* (2013.01); *G01R 31/396* (2019.01); *H01M 10/425* (2013.01);
(Continued)

(58) Field of Classification Search
CPC ....... H01M 10/48; H01M 10/42; H01M 10/50
See application file for complete search history.

(56) References Cited

U.S. PATENT DOCUMENTS 5,037,756 A    8/1991    Bollum et al.
6,275,042 B1   8/2001    Tsai
(Continued)

FOREIGN PATENT DOCUMENTS

CN    101022180 A    8/2007
EP    2216872 A2     8/2010
(Continued)

OTHER PUBLICATIONS

United States International Examination Authority; Chapter II Demand as filed on Nov. 27, 2018 for PCT/US2017/045468; 10 pages; US.
(Continued)

*Primary Examiner* — Kenneth J Douyette
(74) *Attorney, Agent, or Firm* — Kelly Kordzik; Jerry Keys; Matheson Keys & Kordzik PLLC

(57) ABSTRACT

A battery monitoring circuit measures individual battery cell voltages and temperatures of a plurality of series-connected battery cells utilizing an Analog Front End, a controller that collects and analyzes the data digitally transferred to it by the Analog Front End, and a Fuel Gauge configured to measure a single battery cell.

20 Claims, 3 Drawing Sheets

(52) U.S. Cl.
    CPC .. *H01M 10/486* (2013.01); *H01M 2010/4278* (2013.01); *H01M 2220/20* (2013.01)

(56) References Cited

U.S. PATENT DOCUMENTS

| | | | |
|---|---|---|---|
| 2008/0116852 A1* | 5/2008 | Kuo | H02J 7/0029 |
| | | | 320/136 |
| 2010/0194340 A1 | 8/2010 | Lim | |
| 2015/0145467 A1 | 5/2015 | Zhu et al. | |
| 2015/0380966 A1 | 12/2015 | Alessandro et al. | |
| 2016/0260943 A1 | 9/2016 | Tamburrino | |

FOREIGN PATENT DOCUMENTS

| | | |
|---|---|---|
| EP | 2216872 A2 | 11/2010 |
| JP | 2000-092733 A | 3/2000 |
| JP | 2007-240523 A | 9/2007 |
| JP | 2010-1883829 A | 8/2010 |
| JP | 2010-255857 A | 9/2010 |
| JP | 2010213445 A | 9/2010 |
| JP | 2016121931 A | 7/2016 |

OTHER PUBLICATIONS

Russian International Searching Authority; International Search Report & Written Opinoin for PCT/US2017/045468; dated Nov. 17, 2017; 8 pages.

On Semiconductor; Battery Fuel Gauge IC (LC709203F); Battery Fuel Gauge IC for 1-Cell Lithium-ion (Li+); Application Note Ver2.00; 16 pages; downloaded from the Internet on Jun. 23, 2017; Semiconductor Components Industries, LLC; Phoenix, AZ; US.

Texas Instrucments; Multicell Li-Ion and Li-Pol Battery Gas-Gauge Application Using the bq26500; Application report SLUA300; 5 pages; Jan. 2004; Dallas, TX; US.

Karpink Oleksandr; Power Management—Battery Charger with Cell-Balancing and Fuel Gauge Function Support; Document No. 001-15223 Rev. C; 14 pages; © Cypress Semiconductor Corporation, 2007-2017; San Jose, CA; US.

European Patent Office; European Extended Search Report for corresponding Serial No. 17896129.8; dated Dec. 4, 2020; 7 pages; Munich, DE.

Japanese Patent Office; Office Action issued for corresponding JP Application No. 2019-536291; dated Apr. 12, 2021; 4 pages; Tokyo, JP.

* cited by examiner

MONITORING SYSTEM FOR SERIES-CONNECTED BATTERY CELLS

This application claims priority U.S. provisional patent application Ser. No. 62/456,371, which is hereby incorporated by reference herein.

TECHNICAL FIELD

The present invention relates in general to battery technology, and in particular, to a system for monitoring battery cells.

BACKGROUND INFORMATION

Modern electronics are becoming more diverse and increasingly portable, driving demand for improvements in the performance of batteries and battery management systems. With increasing capabilities and performance, power demands are also increasing. The Smart Battery System ("SBS") specification was created to optimize performance, extend battery lifetime, and provide industry standard uniformity to the monitored parameters within a battery system. Integrated circuits ("IC") have been created and programmed with internal software routines to allow batteries to operate in accordance with the SBS specification. Examples of the types of ICs that have been developed for use in battery systems include Analog Front End ("AFE") measurement systems, which are usually combined with some type of Fuel Gauge IC that is intended to precisely estimate state of charge ("SOC") and the amount of remaining energy stored in a battery. In some cases, these two functional components are combined into one package.

High cell count battery packs, particularly those that configure battery cells in series to increase the terminal voltage of the battery pack, and high discharge rate battery cells where the discharge rate exceeds 5 times capacity (5C) present new challenges related to fuel gauging accuracy and decision making to properly assess battery health, as well as optimize performance.

Popular integrated circuit based industry standard algorithms for battery fuel gauging include Impedance Track ("IT") by Texas Instruments and the ModelGauge m3 and m5 algorithms available from Maxim Integrated. These algorithms utilize instantaneous temperature, voltage, and current inputs to estimate SOC and remaining charge. By integrating the amount of charge passed into and out of the battery during charge and discharge events, respectively, and combining this measurement of accumulated passed charge with high-accuracy cell voltage and temperature measurements, the devices are able to derive a dependable and accurate estimate of the instantaneous state of charge of the battery and remaining battery capacity.

The overwhelming majority of Fuel Gauge ICs sold today are intended for single battery cell applications, such as cell phones, MP3 players, and some tablet computers. These "single cell" Fuel Gauge ICs are the lowest cost parts available on the market suitable for this purpose. These are commonly referred to as 1S gauges (indicating that they are for use with 1 series cell). Fuel Gauge ICs exist for applications like notebook computers that use multiple cells connected in series, but these are usually limited to 4 cell configurations (4S gauges). There are very few choices available on the market that are optimized for series cell counts higher than 4, and almost none for cell counts higher than 6.

Additionally, innovation and fuel gauging algorithm performance enhancements are occurring first in the high-volume single cell gauges, and are slow to come to the multiple cell count ICs. There exists a significant advantage in both cost and performance if single cell ICs could be effectively utilized in multiple cell applications.

A typical circuit configuration for single cell battery fuel gauging is illustrated in FIG. 1. The fuel gauge IC contains a single analog input for measurement of each critical parameter—cell terminal voltage, a voltage corresponding to cell temperature (often using an inexpensive thermistor), and battery charge and discharge current (using a low value current sense resistor). There are no provisions for measuring the voltage or temperature of more than one cell.

DETAILED DESCRIPTION

Figure 1:
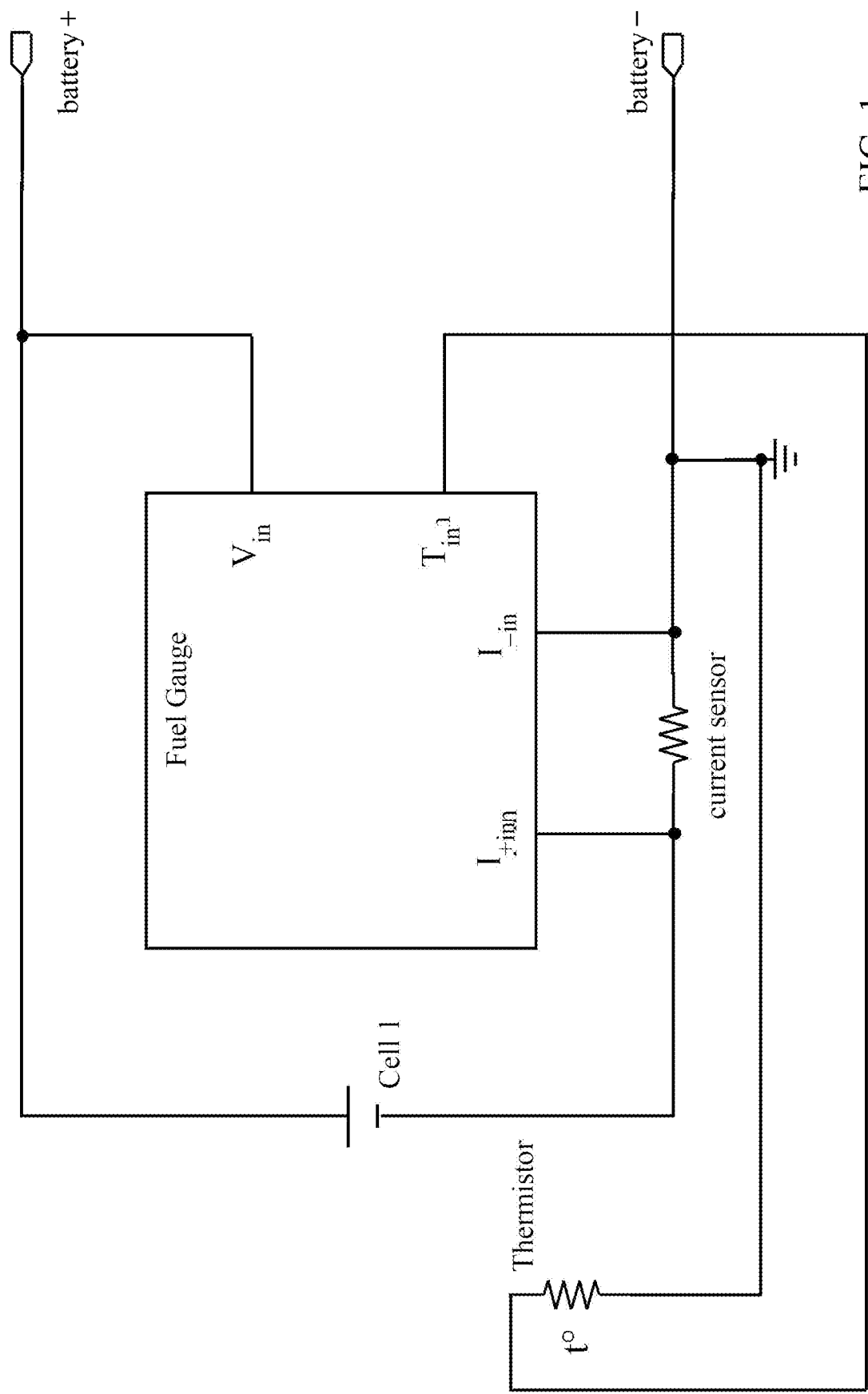
FIG. 1 illustrates a block diagram of a prior art single cell fuel gauge IC connection scheme.
Figure 2:
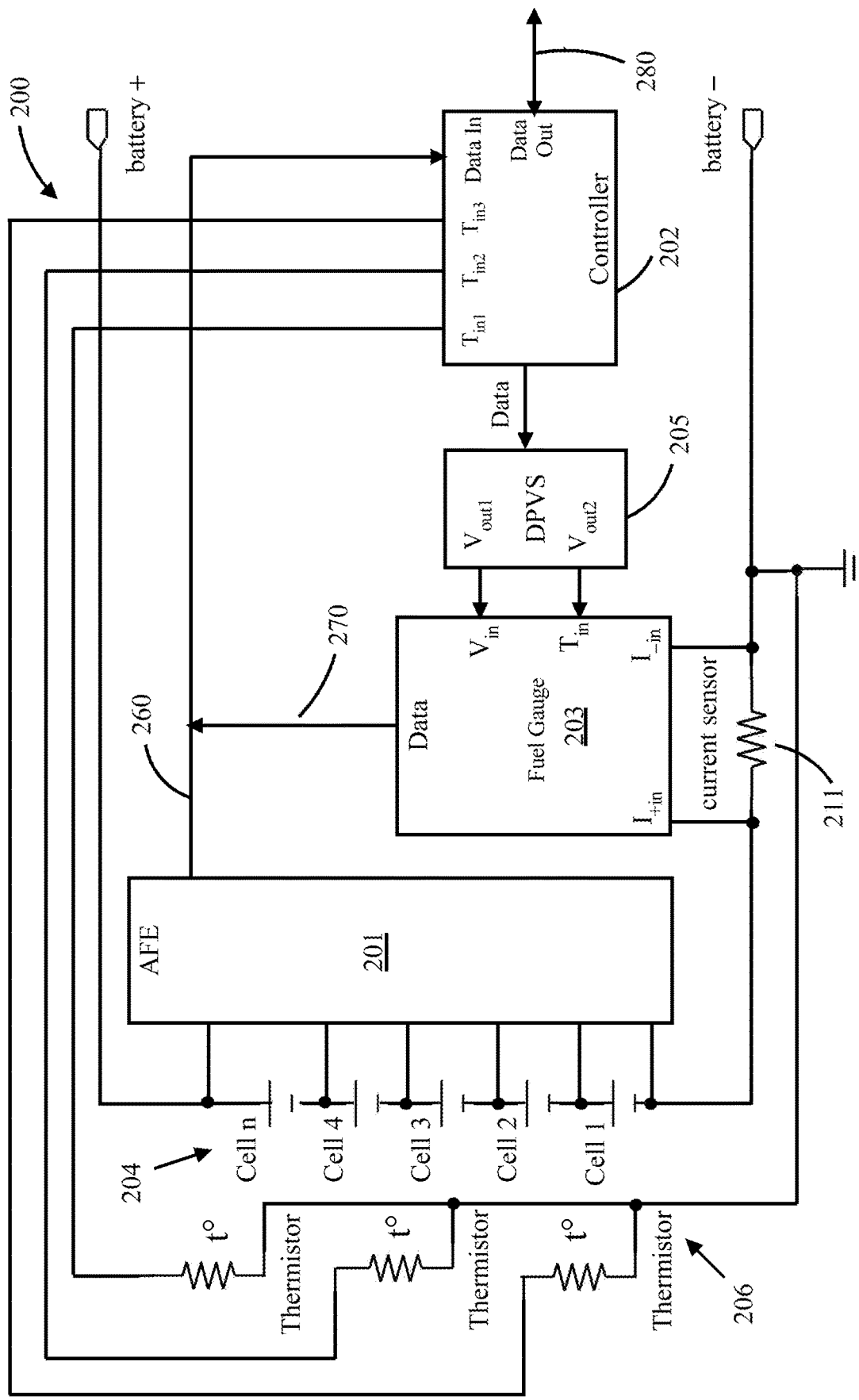
FIG. 2 illustrates a block diagram of multiple battery cell fuel gauge system configured in accordance with embodiments of the present invention.

Referring to FIG. 2, embodiments of the present invention provide a battery monitoring circuit 200 utilizing a commercially available Analog Front End measurement circuit ("AFE") 201 (which may also be referred to herein as simply an "analog front end" and which may be implemented as an IC) for measuring individual cell voltages and temperatures of a plurality of series-connected cells 204 (e.g., model no. MAX 11068 commercially available from Maxim Integrated, or any other equivalent device). The battery monitoring circuit 200 also includes a controller 202 (which may be implemented as a microcontroller) that collects and analyzes the data digitally transferred to it by the AFE 201, one or more digitally programmable voltage sources ("DPVS's") 205, a single cell Fuel Gauge IC 203 (which may also be referred to herein as simply a "fuel gauge") such as the one described with respect to FIG. 1 (i.e., the single cell Fuel Gauge IC 203 contains a single analog input for measurement of each critical parameter: cell terminal voltage, a voltage corresponding to cell temperature (e.g., often using an inexpensive thermistor), and a current sensor 211 for providing battery charge and discharge current (e.g., any commercially available low value current sense resistor may be utilized, or a current sensor implemented within the AFE 201 may be utilized if available).

Embodiments of the present invention are configured to operate with the AFE 201 directly measuring voltage and temperature parameters from each individual battery cell (e.g., Cell 1 . . . Cell n, where n is a positive integer) in a series-connected battery assembly 204. Within embodiments of the present invention, n is greater than 1, and may be greater than 4. The AFE 201 then digitally communicates its cell-by-cell voltage and temperature measurements to the controller 202 (e.g., through a digital communications protocol such as I²C, UART, SMB, or some other digital data communication scheme) over a signal line 260. The controller 202 contains a control program pre-programmed as desired to process and manipulate the incoming cell voltage and temperature data, determining values like minimum, maximum, average, weighted average, or any other numerical representation of values that can be derived from the actual measured values for both cell voltages and temperatures, and preparing this data for presentation to the Fuel Gauge IC 203. Because the inputs of inexpensive Fuel Gauge ICs are exclusively analog in nature, the controller 202 forwards the selected and processed cell voltage and voltage corresponding to temperature information in digital form to the one or more DPVS's 205, which convert the digital data to analog representations of cell voltage and voltage corresponding to temperature, respectively. The analog output (e.g., $V_{out1}$, $V_{out2}$) of each DPVS 205 is connected directly to each analog input (e.g., $V_{in}$, $T_{in}$) of the Fuel Gauge IC 203.

Each individual DPVS may be configured as a digital-to-analog converter ("DAC"), a pulse width modulated ("PWM") controlled voltage source, or any other suitable type of digitally programmable voltage source that has a programmable and stable analog voltage output. Different types of DPVS could be used in the same system (e.g., a DAC for voltage and a PWM for voltage corresponding to temperature). Each DPVS may be configured so that its output has a low periodic and random deviation (i.e., low noise), a low voltage deviation or drift, a voltage set point precision of +/−1 mV, and fast response and settling times to changes in programmed output voltage levels.

The one or more DPVS's may be configured as a functional block implemented within the controller 202, or be a separate module existing outside the controller 202 and connected to the controller 202 externally by a digital communication bus, such as depicted in FIG. 2.

The Fuel Gauge IC 203 may have one or more digital outputs, and may include a special purpose general purpose input/output ("GPIO") pin and/or analog outputs for system control. Within embodiments of the present invention, the internal control and fuel gauging algorithms that are programmed by the Fuel Gauge manufacturer and exist in the Fuel Gauge IC 203 for use with a single battery cell are completely unmodified. The fuel gauge algorithm, although unmodified, is configured in the system 200, in accordance with embodiments of the present invention, to function in a multi-cell environment as a result of the presentation at the inputs (e.g., $V_{in}$, $T_{in}$) to the Fuel Gauge IC 203 of processed/manipulated/optimized values for analog cell voltage and voltage corresponding to temperature, which are selected or otherwise derived by the controller 202 from the data aggregated from any number of the n series-connected cells as described herein. The digital output 270 of the Fuel Gauge IC 203 can return a package of data or commands back to the controller 202, which stores and processes this data and may utilize it for control of the battery assembly 204 or for presentation of status information or warning messages to an outside device or user (e.g., see FIG. 3). The digital output communications from the Fuel gauge IC 203 to the controller 202 (e.g., via a data bus 270), and from the controller 202 to an external device or user (e.g., via a data bus 280) can be sent through $I^2C$, UART, SMB, or any other digital data communication protocol. The digital data may be configured in accordance with embodiments of the present invention to contain commands directed to an outside system or user (e.g., see FIG. 3) to control battery charging (e.g., to connect or disconnect a battery charger) or battery discharging (e.g., to turn on or off a power load). For example, the digital data may contain information related to the State of Charge, State of Health, or other fuel gauge parameters intended to indicate the current status of the battery assembly 204, though the present invention is not intended to be limited to only these forms of information.

The system 200 can be configured so that one or more temperatures within the vicinity of one or more battery cells in the battery assembly 204 is measured using any number of N (where N≥1) thermocouples or thermistors 206 located at different places in proximity to the battery assembly 204, which output their results to one or more inputs (e.g., $T_{in1}$, $T_{in2}$, ... $T_{in3}$) the controller 202. The controller 202 may be configured to compare the individual temperatures and select a minimum, maximum, average, or any other representation of temperature for presentation to the Fuel Gauge IC 203 depending on the state of the battery assembly 204. For example, the maximum temperature could be used for fuel gauging during a discharge, the average temperature could be used during charging, or data from damaged or non-working thermistors 206 could be discarded from the calculations by the controller 202, thus improving the fault tolerance of the system 200.

Voltages from any of the n individual cells measured by the AFE 201 may be handled similarly. In very high cell count battery assemblies 204, one or more such AFE circuits, or ICs, could be "stacked," allowing the battery cell count (i.e., n) to increase from tens to hundreds of cells. Applications of such high cell counts are common in the automotive industry. In such a configuration, the measured cell voltages may be collected by the controller 202 from the AFE's 201 across the digital communication connection, and the controller 202 could interpret the measured cell voltages and execute programmed logical operations and optimizations based upon the current state of the battery assembly 204.

Once the cell voltages and temperatures have been collected and processed, the controller 202 is then configured to transmit the processed/manipulated/optimized digital representation of cell voltage, and/or voltage corresponding to temperature, to the one or more DPVS's 205. The one or more DPVS's 205 then convert the digital representations of cell voltage and/or voltage corresponding to temperature to their analog equivalents and present these analog equivalents to the analog inputs of the Fuel Gauge IC 203. The Fuel Gauge IC 203 then accepts the analog inputs for voltage and voltage corresponding to temperature and uses these as inputs to its internal algorithms. The controller 202 may be pre-programmed to be responsible for ensuring the one or more DPVS's 205 are continuously fed with data that is processed/manipulated/optimized for accurate fuel gauging. Processed/manipulated/optimized data can be a single instantaneous measurement of the highest or lowest cell voltage or temperature in the battery assembly 204, averaged measurement, minimum measurement, maximum measurement, or any other derived representation of voltage, temperature or other parameter, selected based on battery condition, instantaneous operating point, or state of health.

Processed/manipulated/optimized data presented to the Fuel Gauge IC 203 can be different during different operating states of the battery assembly 204, such as resting, charging, or discharging.

In high cell count battery assemblies, there is certain to be a slight but measurable mismatch in capacity across the different battery cells in the battery assembly 204. This means that during a discharge, one (or more) of the n battery cells will run out of energy before the remaining battery cells, forcing a premature shortening of the discharge time duration. Sometimes this shortened run time can be significant, especially after battery cells experience the aging effects of high temperature and cycling. In a battery assembly having a large number of series-connected battery cells, normal fuel gauge ICs would only look at a single battery cell (1S gauges) or a small portion of the total cell stack (4S gauges), and cannot detect a voltage of a single battery cell that is not directly in its measurement domain. By individually monitoring voltages of all of the n battery cells via the AFE's 201 and using the methodology described herein, the controller 202 can be configured to optimize the accuracy of the Fuel Gauge algorithms and the resulting state of charge and remaining capacity estimates returned by the Fuel Gauge IC 203 by selecting and presenting the most appropriate battery cell voltage to the Fuel Gauge IC 203 on a second-by-second basis. During discharge, minimum cell voltage can be used to most accurately predict the end of discharge threshold; and during battery charging, an average voltage of all of the n battery cells may be utilized to provide the best estimate of state of charge of the entire battery assembly 204. These decisions as to what represents processed/manipulated/optimized data to be presented by the controller 202 to the Fuel Gauge IC 203 may be pre-programmed into the internal software of the controller 202.

In addition, certain fuel gauges, such as the Impedance Track fuel gauges, create an internal table of internal cell resistance at different states of charge during operation. This table is created by analyzing cell voltage deviation versus instantaneous current during a discharge, and correlating this to state of charge. It may be important to determine and track the battery cell with the highest impedance, as this is (1) the best determination of aging of the entire battery assembly 204, and (2) will be the limiting factor in being able to support a high discharge current. Embodiments of the present invention provide the ability for the impedance measuring algorithm to always be presented with the voltage data from the individual battery cell with the highest impedance so that the accuracy and usefulness of the impedance table is always assured.

Figure 3:
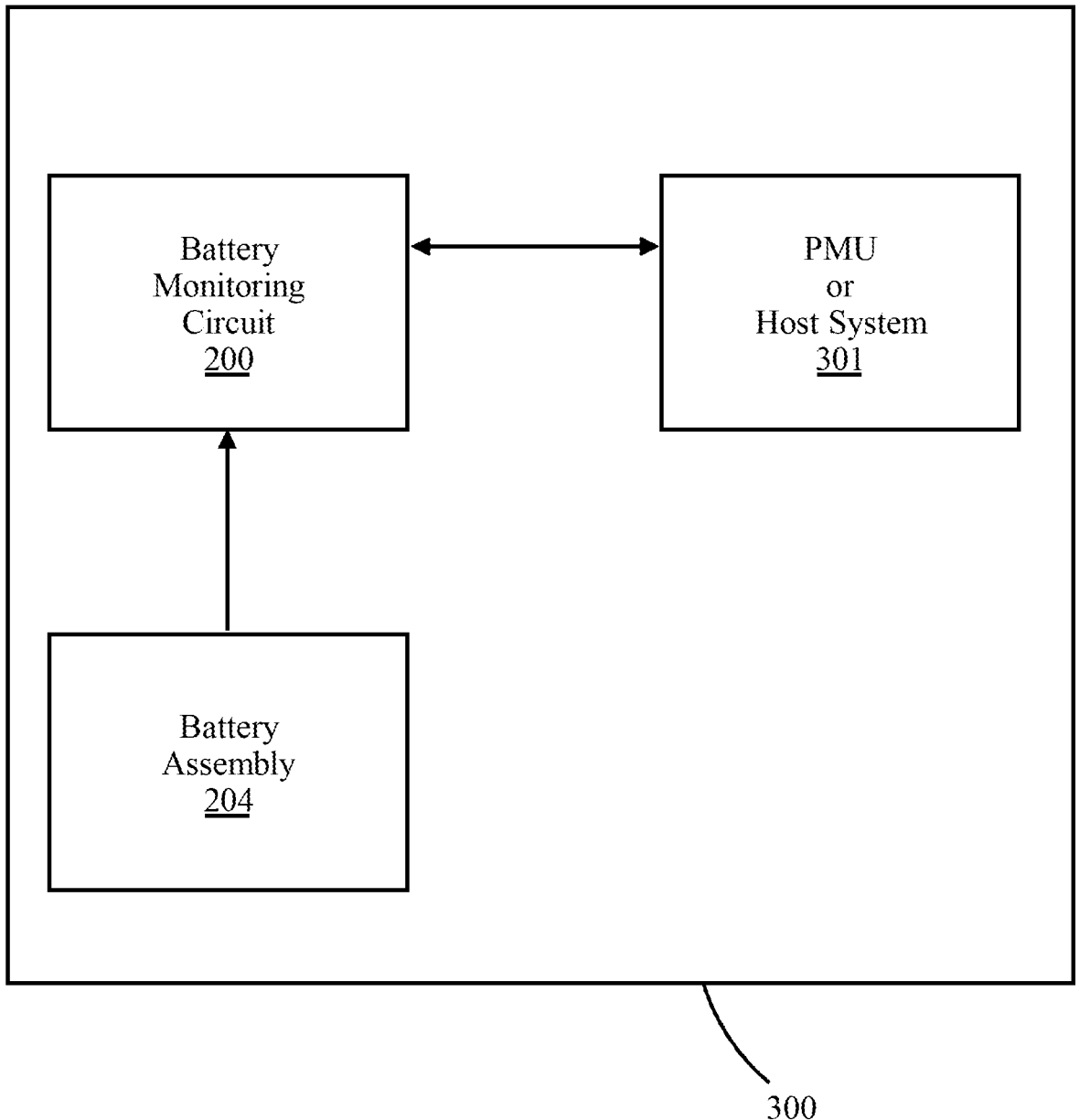
FIG. 3 illustrates an example of an apparatus configured with embodiments of the present invention.

FIG. 3 illustrates an apparatus 300 that may be configured with embodiments of the present invention. The apparatus 300 may be any device that utilizes a multi-cell battery assembly 204 for internal power. Such an apparatus 300 may be a rack of computer systems, an ebike, an electric motorcycle, an electric vehicle, a hybrid vehicle, etc. Within exemplary embodiments of the present invention, the battery monitoring circuit 200, which is coupled to the battery assembly 204 as illustrated in FIG. 2, may be in electronic communication with a power management unit ("PMU"), or any other host system 301, such as a computer display, computer system, or any other suitable device.

Within embodiments of the present invention, control programs pre-programmed into the controller 202 (e.g., for implementing the various functionalities disclosed herein) may be input into the controller 202 through a data bus 280 coupling the controller 202 to the PMU or host system 301. Furthermore, data outputs from the Fuel Gauge IC 203, which may be transmitted to the controller 202 via the signal line 270, may then be forwarded to the PMU or host system 301 by the controller 202 via the data bus 280.

Unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and resources described herein. This is done merely for convenience, and to give a general sense of the scope of the invention. This description should be read to include one, or at least one, and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described herein.

To the extent not described herein, many details regarding specific materials, processing acts, and circuits are conventional, and may be found in textbooks and other sources within the computing, electronics, and software arts.

It will be understood that particular embodiments described herein are shown by way of illustration and not as limitations of the invention. The principal features of this invention can be employed in various embodiments without departing from the scope of the invention.

What is claimed is:

1. A system configured for monitoring a plurality of battery cells in a multi-cell battery assembly, comprising:
    an analog front end configured to receive voltage signals from each of the plurality of battery cells;
    a controller configured to receive an output from the analog front end and produce a digital signal as a function of a pre-programmed algorithm performed on the output from the analog front end;
    circuitry configured to convert the digital signal to an analog voltage signal; and
    a fuel gauge configured to receive and process the analog voltage signal.

2. The system as recited in claim 1, wherein the fuel gauge is a single-cell fuel gauge having a first single analog input for measuring battery cell terminal voltage.

3. The system as recited in claim 2, wherein the single-cell fuel gauge has a second single analog input for measuring battery cell temperature, and third and fourth single analog inputs for measuring battery cell charge and discharge currents.

4. The system as recited in claim 1, wherein the circuitry configured to convert the digital signal of the controller to the analog voltage signal comprises a digitally programmable voltage source ("DPVS").

5. The system as recited in claim 4, wherein the DPVS comprises a digital-to-analog converter.

6. The system as recited in claim 1, further comprising a thermistor configured to be in proximity to the battery assembly, wherein an output of the thermistor is configured to be coupled to an input to the controller.

7. The system as recited in claim 1, further comprising a current sensor configured to be coupled to the battery assembly, wherein outputs of the current sensor are configured to be coupled to analog inputs of the fuel gauge.

8. The system as recited in claim 1, wherein the analog front end is configured to receive voltage signals from more than four battery cells in the battery assembly.

9. The system as recited in claim 6, wherein the controller and the circuitry are configured to output a single voltage signal representing battery cell temperature to the fuel gauge.

10. The system as recited in claim 1, further comprising a host system configured to digitally communicate with the controller.

11. The system as recited in claim 1, further comprising a digital signal output of the fuel gauge coupled to a digital input of the controller.

12. A battery system comprising:
a plurality of battery cells in a multi-cell battery assembly;
an analog front end configured to receive voltage signals from each of the plurality of battery cells and produce a first data signal as a function of the received voltage signals from each of the plurality of battery cells;
a controller configured to receive the first data signal from the analog front end and produce a second data signal as a function of a pre-programmed algorithm performed on the first data signal from the analog front end;
a first digitally programmable voltage source ("DPVS") configured to convert the second data signal to a first analog voltage signal representing a battery cell voltage parameter; and
a fuel gauge configured to receive and process the first analog voltage signal.

13. The battery system as recited in claim 12, wherein the fuel gauge is a single-cell fuel gauge having a single analog input for measuring battery cell terminal voltage, wherein the single analog input for measuring battery cell terminal voltage is configured to receive the first analog voltage signal from the first DPVS.

14. The battery system as recited in claim 13, wherein the fuel gauge includes a pair of analog inputs configured to measure battery cell charge and discharge currents.

15. The battery system as recited in claim 12, further comprising a current sensor coupled between the multi-cell battery assembly and the pair of analog inputs of the fuel gauge configured to measure battery cell charge and discharge currents.

16. The battery system as recited in claim 12, further comprising a thermistor configured to be in proximity to the battery assembly, wherein an output of the thermistor is configured to be coupled to an input to the controller, wherein the controller is further configured to receive the output of the thermistor and produce a third data signal as a function of a pre-programmed algorithm performed on the output of the thermistor.

17. The battery system as recited in claim 16, further comprising a second DPVS configured to convert the third data signal to a second analog voltage signal representing a temperature parameter pertaining to the output of the thermistor, and wherein the single-cell fuel gauge has a single analog input for measuring battery cell temperature, wherein the single analog input for measuring battery cell temperature is configured to receive the second analog voltage signal from the second DPVS.

18. The battery system as recited in claim 17, wherein the fuel gauge is configured to transmit to the controller output data signals created as a function of the processing of the first and second analog voltage signals.

19. An apparatus comprising:
a plurality of battery cells in a multi-cell battery assembly;
an analog front end configured to receive voltage signals from each of the plurality of battery cells and produce a first data signal as a function of the received voltage signals from each of the plurality of battery cells;
a controller configured to receive the first data signal from the analog front end and produce a second data signal as a function of a pre-programmed algorithm performed on the first data signal from the analog front end;
a thermistor configured to be in proximity to the battery assembly, wherein an output of the thermistor is configured to be coupled to an input to the controller, wherein the controller is further configured to receive the output of the thermistor and produce a third data signal as a function of a pre-programmed algorithm performed on the output of the thermistor;
a first digitally programmable voltage source ("DPVS") configured to convert the second data signal to a first analog voltage signal representing a battery cell voltage parameter;
a second DPVS configured to convert the third data signal to a second analog voltage signal representing a temperature parameter pertaining to the output of the thermistor;
a power management unit or host system coupled to the controller by a digital communications link; and
a fuel gauge configured to receive and process the first and second analog voltage signals, wherein the fuel gauge is a single-cell fuel gauge having a single analog input for measuring battery cell terminal voltage, wherein the single analog input for measuring battery cell terminal voltage is configured to receive the first analog voltage signal from the first DPVS, and wherein the single-cell fuel gauge has a single analog input for measuring battery cell temperature, wherein the single analog input for measuring battery cell temperature is configured to receive the second analog voltage signal from the second DPVS, wherein the fuel gauge is configured to transmit to the controller the output data signals which the controller is then configured to forward to the power management unit or host system via the digital communications link.

20. The apparatus as recited in claim 19, wherein the multi-cell battery assembly is configured to power an electric vehicle.

* * * * *